United States Patent
Wei et al.

(10) Patent No.: US 7,627,077 B2
(45) Date of Patent: Dec. 1, 2009

(54) SHIFT REGISTER WITH INDIVIDUAL DRIVING NODE

(75) Inventors: Chun-ching Wei, Hsin-Chu (TW);
Shih-hsun Lo, Hsin-Chu (TW);
Yen-hsien Yeh, Hsin-Chu (TW);
Chen-lun Chiu, Hsin-Chu (TW);
Yang-en Wu, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 13 days.

(21) Appl. No.: 12/122,036

(22) Filed: May 16, 2008

(65) Prior Publication Data

US 2008/0285705 A1 Nov. 20, 2008

(30) Foreign Application Priority Data

May 18, 2007 (TW) .............................. 96117679 A (51) Int. Cl.
*G11C 19/00* (2006.01)
(52) U.S. Cl. .............................. 377/64; 377/75; 377/78; 377/79
(58) Field of Classification Search ................... 377/64, 377/75, 77–81, 68
See application file for complete search history.

(56) References Cited

U.S. PATENT DOCUMENTS

| | | | |
|---|---|---|---|
| 6,845,140 B2 | 1/2005 | Moon et al. | |
| 7,283,603 B1 * | 10/2007 | Chien et al. | 377/64 |
| 7,342,568 B2 * | 3/2008 | Wei et al. | 345/100 |
| 7,369,111 B2 * | 5/2008 | Jeon et al. | 345/100 |
| 7,450,681 B2 * | 11/2008 | Wei et al. | 377/64 |
| 2005/0156856 A1 | 7/2005 | Jang et al. | |
| 2007/0035505 A1 * | 2/2007 | Lin et al. | 345/100 |
| 2007/0040793 A1 * | 2/2007 | Kim et al. | 345/100 |

* cited by examiner

*Primary Examiner*—Tuan Lam
(74) *Attorney, Agent, or Firm*—Kirton & McConkie; Evan R. Witt (57) ABSTRACT

A shift register having individual driving nodes is disclosed. The shift register includes a first clock pull-down module, a second clock pull-down module, a key pull-down module, a self feedback module, and a driving output unit. The first clock pull-down module is used to pull-down the potential of a gate line to a low voltage when the first clock signal is in a high voltage level. The second clock signal pull-down module pulls down the potential of the gate line to the low voltage when the second clock signal is in a high voltage level. The key pull-down module rapidly pulls down the potential of the gate line to the low voltage level after the gate line outputs an output signal. The self feedback module is used to output a driving signal to the key pull-down module. The driving signal output unit outputs a next stage driving signal which is irrelative to the operation of the previous stage shift register.

10 Claims, 9 Drawing Sheets

SHIFT REGISTER WITH INDIVIDUAL DRIVING NODE

FIELD OF THE INVENTION

The present invention relates to a shift register, and more particularly to a single-stage shift register having individual driving node.

BACKGROUND OF THE INVENTION

The displays with advanced functions play an important role in consumer electronic products. Liquid crystal displays serve as the chromatic screens having high resolution, which are widely utilized in mobile phones, personal digital assistants (PDAs), digital still cameras, computer displays, and notebook displays. The shift register, an important electric component in the driving circuit of a liquid crystal display panel, is widely used to drive the display circuits of the liquid crystal display panel. As a result, the design of shift register is closely related to the characteristics of the liquid crystal display panel, such as power consumption and reliability.

Figure 1:
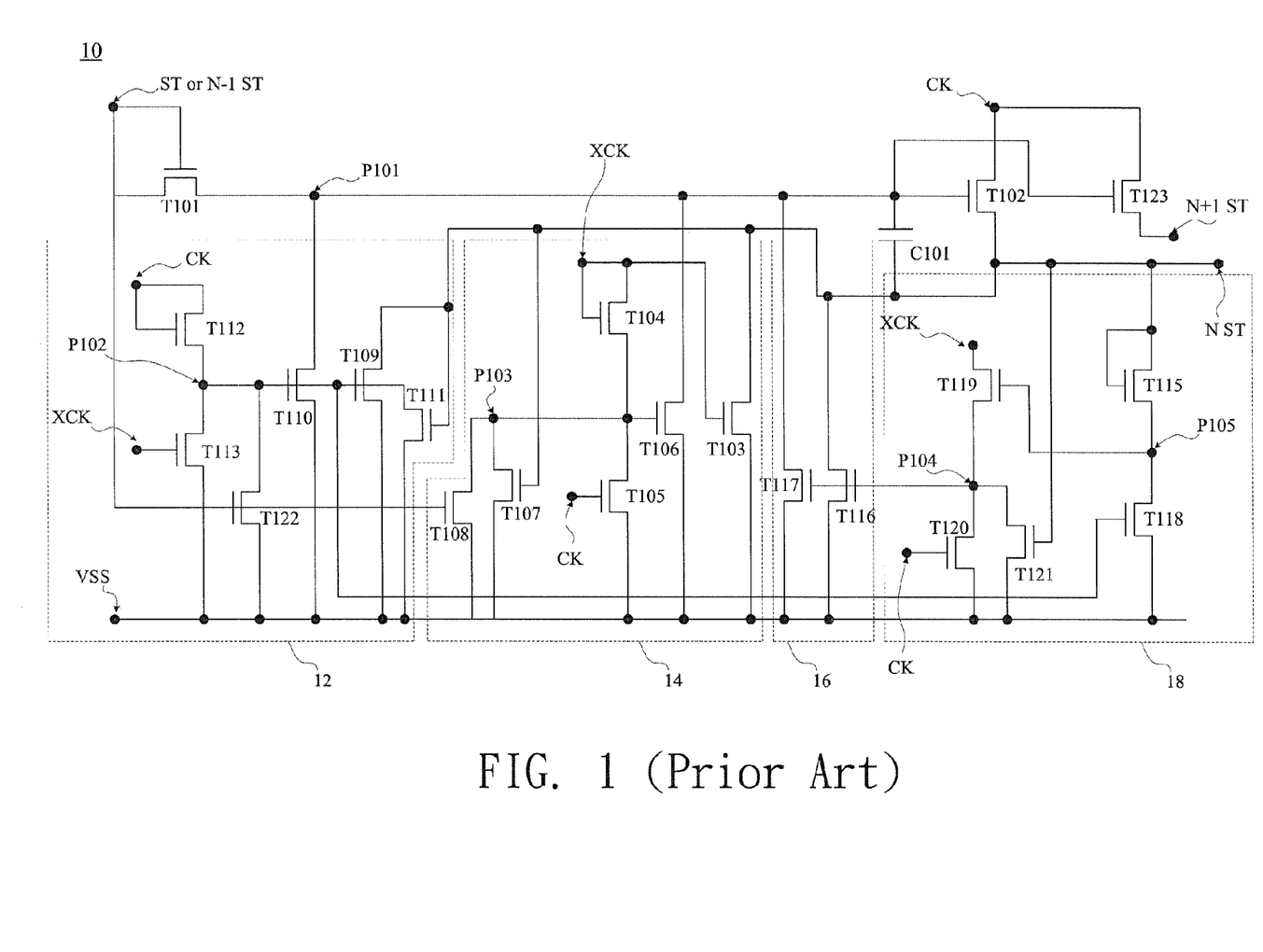
FIG. 1 is a conventional electric circuit of a single-stage shift register.

FIG. 1 is a conventional electric circuit of a single-stage shift register. The shift register 10 includes a "CK" clock pull-down module 12, a "XCK" clock pull-down module 14, a key clock pull-down module 16, and a self-feedback module 18. The signal phase of the "CK" clock pull-down module 12 is opposite to the signal phase of the "XCK" clock pull-down module 14. The "CK" clock pull-down module 12 is composed of six transistors "T109", "T110", "T111", "T112", "T113", and "T122". While the signal voltage level of the "CK" clock pull-down module 12 is high, i.e. the signal voltage level of the "XCK" clock pull-down module 14 is low, transistors "T112" and "T110" are triggered so that the signal voltage levels of node "P101", i.e. gate line, and the gate of transistor "T102" are pulled down to voltage level "VSS" via the transistor "T110". The "XCK" clock pull-down module 14 is composed of six transistors "T103", "T104", "T105", "T106", "T107", and "T108". While the signal voltage level of the "XCK" clock pull-down module 14 is high, i.e. the signal voltage level of the "CK" clock pull-down module 12 is low, transistors "T104" and "T106" are triggered so that the signal voltage levels of node "P101" and the gate of transistor "T102" are pulled down to voltage level "VSS" via the transistor "T106". The key clock pull-down module 16 is composed of two transistors "T116" and "T117" for pulling down the signal voltage levels of node "P101" and the gate of transistor "T102" to voltage level "VSS" via the transistor "T117" after outputting an output signal to node "P101" at the transistor "T102". The self-feedback module 18 is composed of five transistors "T115", "T118", "T119", "T120", and "T121" for outputting a driving signal to the key clock pull-down module 16. The shift register further includes a transistor "T123" for controlling the transmission of the clock signal "CK" to a next driving node "N+1 ST".

For a conventional shift register, the outputting node "N" is used to output the driving signal to pixels within the panel and the driving node "N+1 ST" is used to output the driving signal to the shift register in the next stage. However, due to the circuit configuration of the conventional shift register, transistors "T102" and "T103" cannot be closed normally when the signal of outputting node "N" cannot be changed due to the short or signal errors happening to the pixels within the panel. Thus, the signal voltage level of the driving node "N+1 ST" synchronously changes in accordance with the voltage level of the clock signal "CK" so that the shift registers in different stages cannot operate normally.

Figure 2:
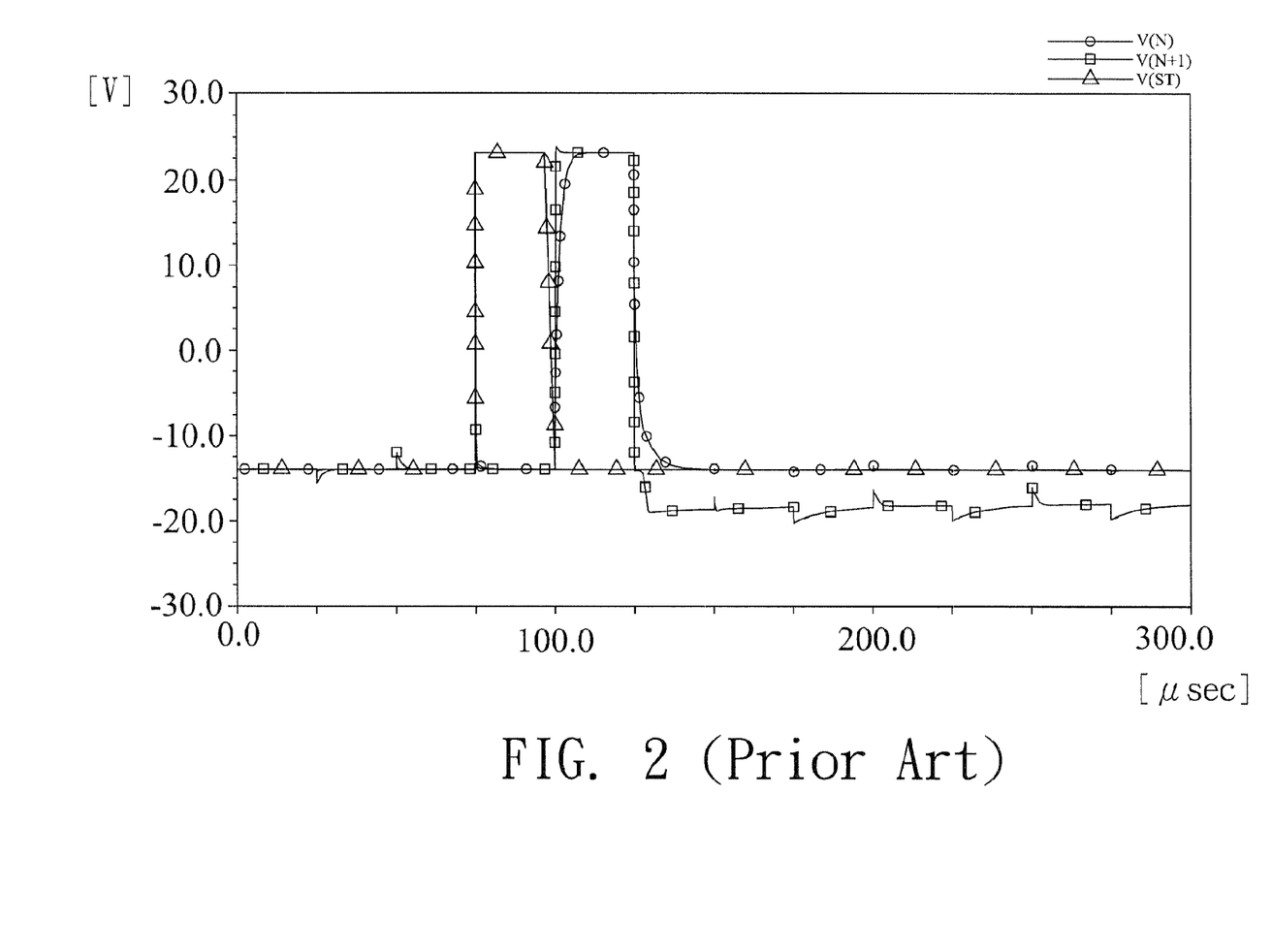
FIGS. 2-4 illustrate timing diagrams of main nodes in conventional single-stage shift register.
Figure 3:
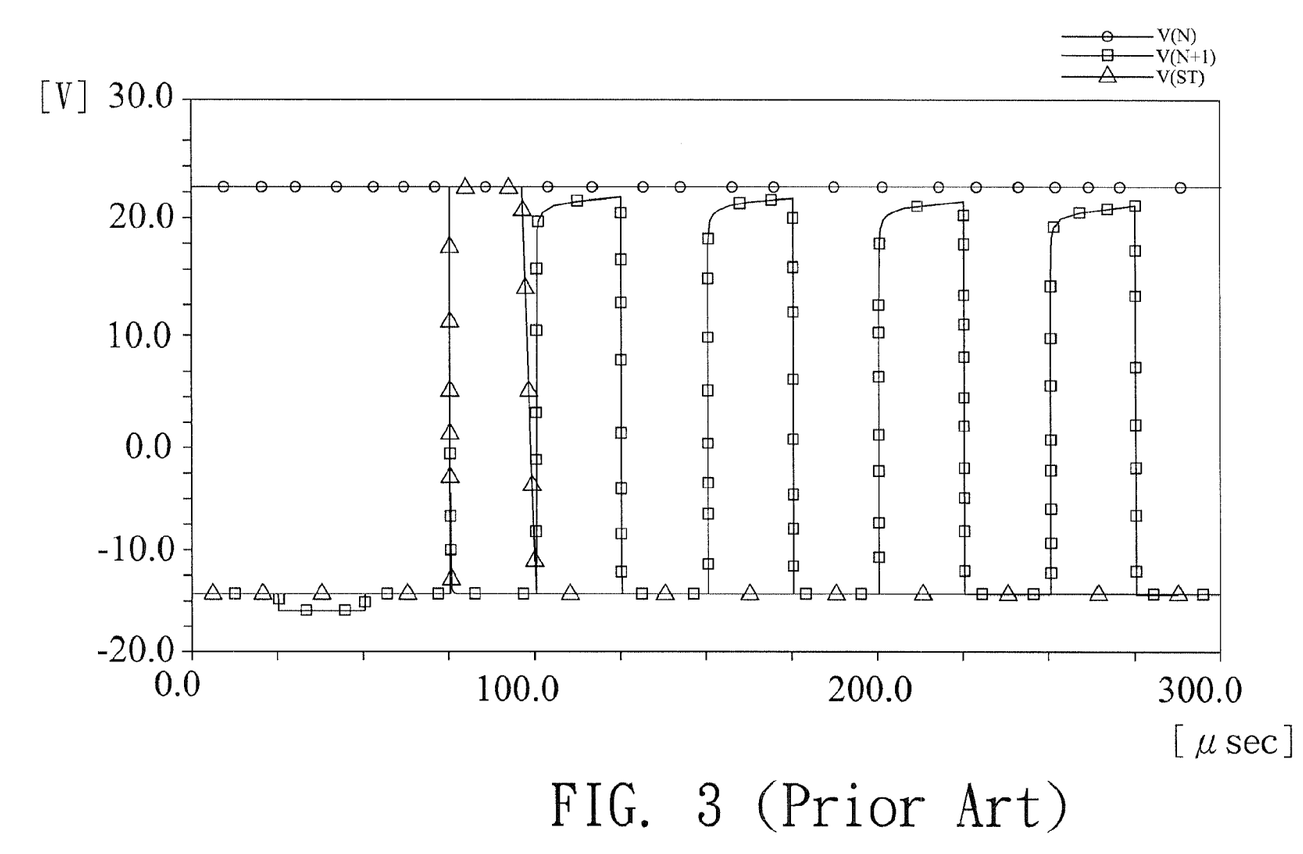
Figure 4:
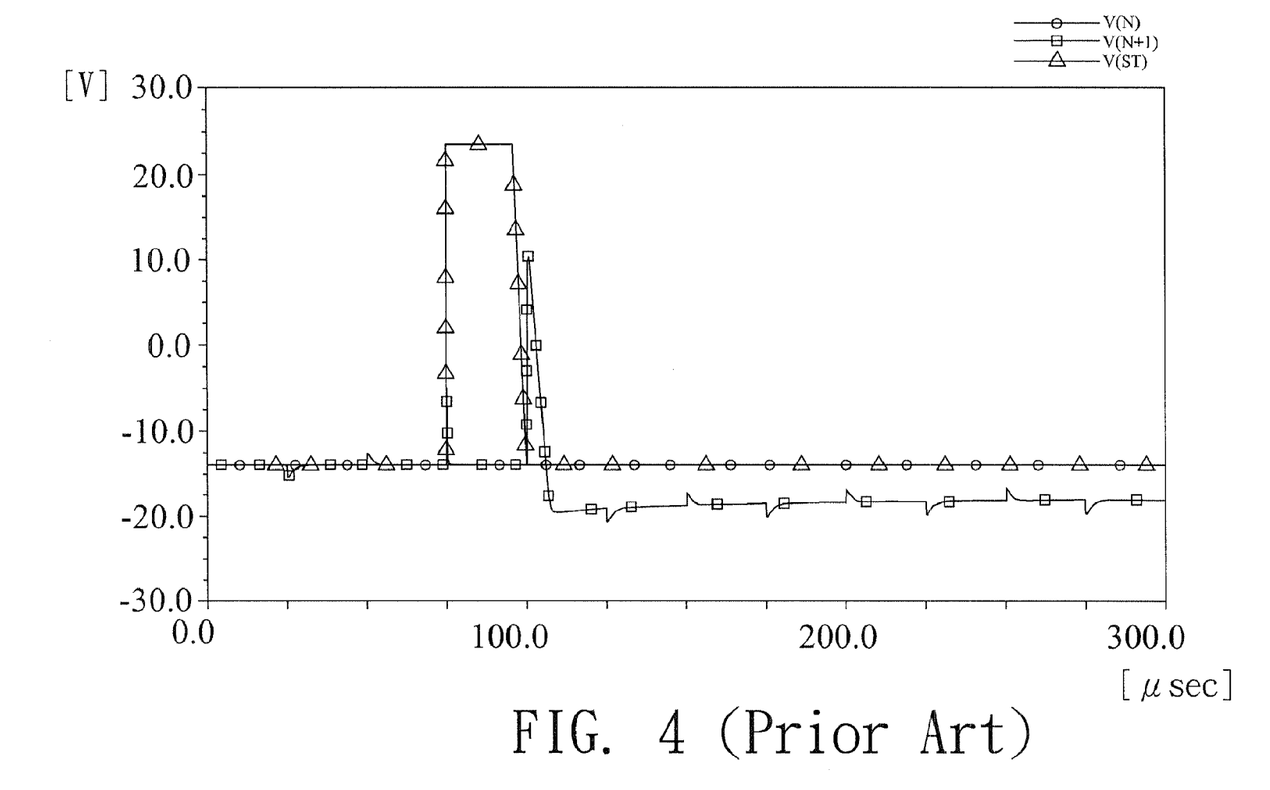

FIGS. 2-4 illustrate timing diagrams of main nodes in conventional single-stage shift register. In FIG. 2, if the waveform "V(N)" in the node "N" and the waveform "V(ST)" in the node "ST" are in normal statuses, the waveform "V(N+1)" in the driving node "N+1 ST" has a normal voltage level and waveform. That is, the waveform "V(N+1)" is a single-triggering square waveform. In FIG. 3, if any short or signal error in the stage "N" occurs to the pixels, the waveform "V(N)" in the node "N" has a fixed high voltage level, the waveform "V(N+1)" in the driving node "N+1 ST" is affected by the waveform "V(N)" in the node "N". Thus, the waveform "V(N+1)" in the driving node "N+1 ST" has continuous square wave so that the pixels in the stage (N+1) has errors and cannot activate correctly.

In FIG. 4, if the pixels have short circuit or signal error in the stage "N" and thus the waveform "V(N)" in the node "N" has a fixed low voltage level, the waveform "V(N+1)" in the driving node "N+1 ST" is affected by the waveform "V(N)" in the node "N". Thus, the waveform "V(N+1)" in the driving node "N+1 ST" has a jump and drops off to low voltage level so that the pixels in the stage (N+1) have errors and cannot operate correctly.

Consequently, the driving signal in the next stage (N+1) is affected by the driving signal of the previous stage (N), the driving signal of the next stage (N+1) cannot operate normally while the driving signal of the previous stage (N) has errors. Such situation affects the operation of the driving circuit of the liquid crystal panel and further increase the complexity while performing a test procedure.

SUMMARY OF THE INVENTION

One objective of the present invention is to provide a single-stage shift register with individual driving node to prevent the abnormal operation of driving circuit due to a driving signal error in signal stage. Further, the complexity of a test procedure of the liquid crystal panel is effectively improved.

According to the objective, the present invention sets forth a single-stage shift register with individual driving node. The shift register with individual driving node includes a first clock pull-down module, a second clock pull-down module, a key clock pull-down module, self-feedback module, and a driving output unit. The first clock pull-down module pulls down a voltage level of the node to a low voltage level while a first clock signal is in a high voltage level. The second clock pull-down module pulls down the voltage level of the node to the low voltage level while a second clock signal is in a high voltage level. The key clock pull-down module pulls down the voltage level of the node to the low voltage level while the node outputs an output signal. The self-feedback module outputs a driving signal to the key clock pull-down module. The driving output unit outputs another driving signal to the shift register in a next stage, wherein the another driving signal of the driving output unit is irrelative to the voltage level change of the driving signal of the self-feedback module.

The shift register of the present invention utilizes a driving output unit for outputting a driving pulse signal to a shift register in next stage so that an incorrect driving signal of the shift register is avoided when the shift register has short circuit or signal error in previous stage. In addition, while performing a test procedure of the panel, the present invention is capable of locating the fault pixels on the panel. Therefore, the test correction of the pixels in next different stages can be completed to reduce the test complexity even though a fault pixel is located in the previous stage.

DETAILED DESCRIPTION OF THE INVENTION

Figure 5:
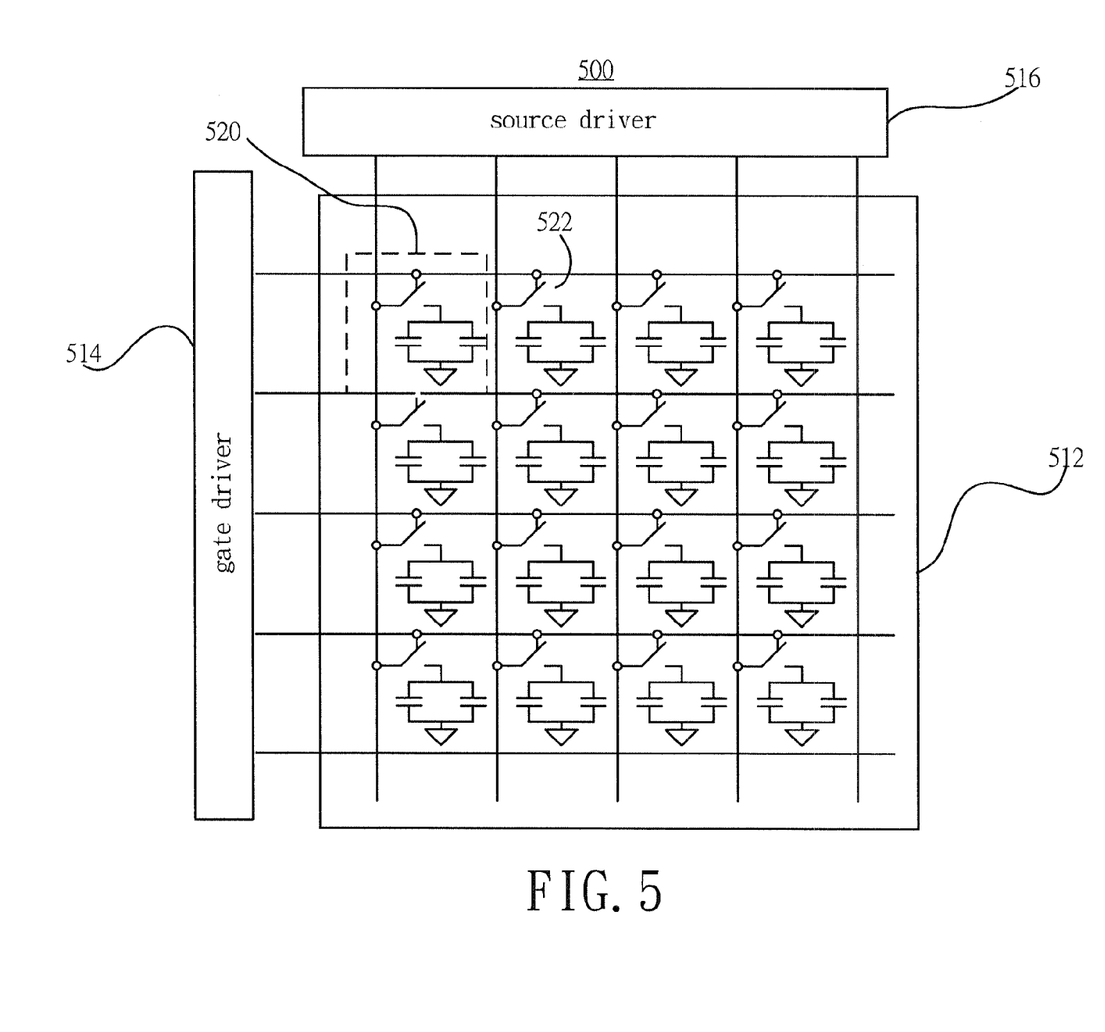
FIG. 5 is a block diagram of a liquid crystal display according to one embodiment of the present invention.

FIG. 5 is a block diagram of a liquid crystal display 500 according to one embodiment of the present invention. The liquid crystal display 500 includes a liquid crystal panel 512, a gate driver 514, and a source driver 516. The liquid crystal panel 512 has a plurality of pixels and each pixel is composed of pixel unit 520 having three primary colors, i.e. red, green, and blue colors, respectively. The gate driver 514 outputs a scan signal so that each transistor 522 in each row is triggered sequentially. Meanwhile, the source driver 516 outputs corresponding data signal to the pixel units 520 in the row so that each pixel unit 520 are charged to display different gray-voltage level correctly. When the transistor 522 in a row are charged completely, the gate driver 514 closes the triggered row and outputs the scan signal for triggering the transistors 522 in the next row. Then, the source driver 516 outputs corresponding data signal for charging the pixel units 520 in the next row until all the pixel units 520 of the liquid crystal panel 512 are charged, and the transistors 522 in the first row repeatedly charged. The equivalent circuit of control circuit of the gate driver 514 is a shift register for outputting a scan signal to the liquid crystal panel 512 at a predetermined time interval.

Figure 6:
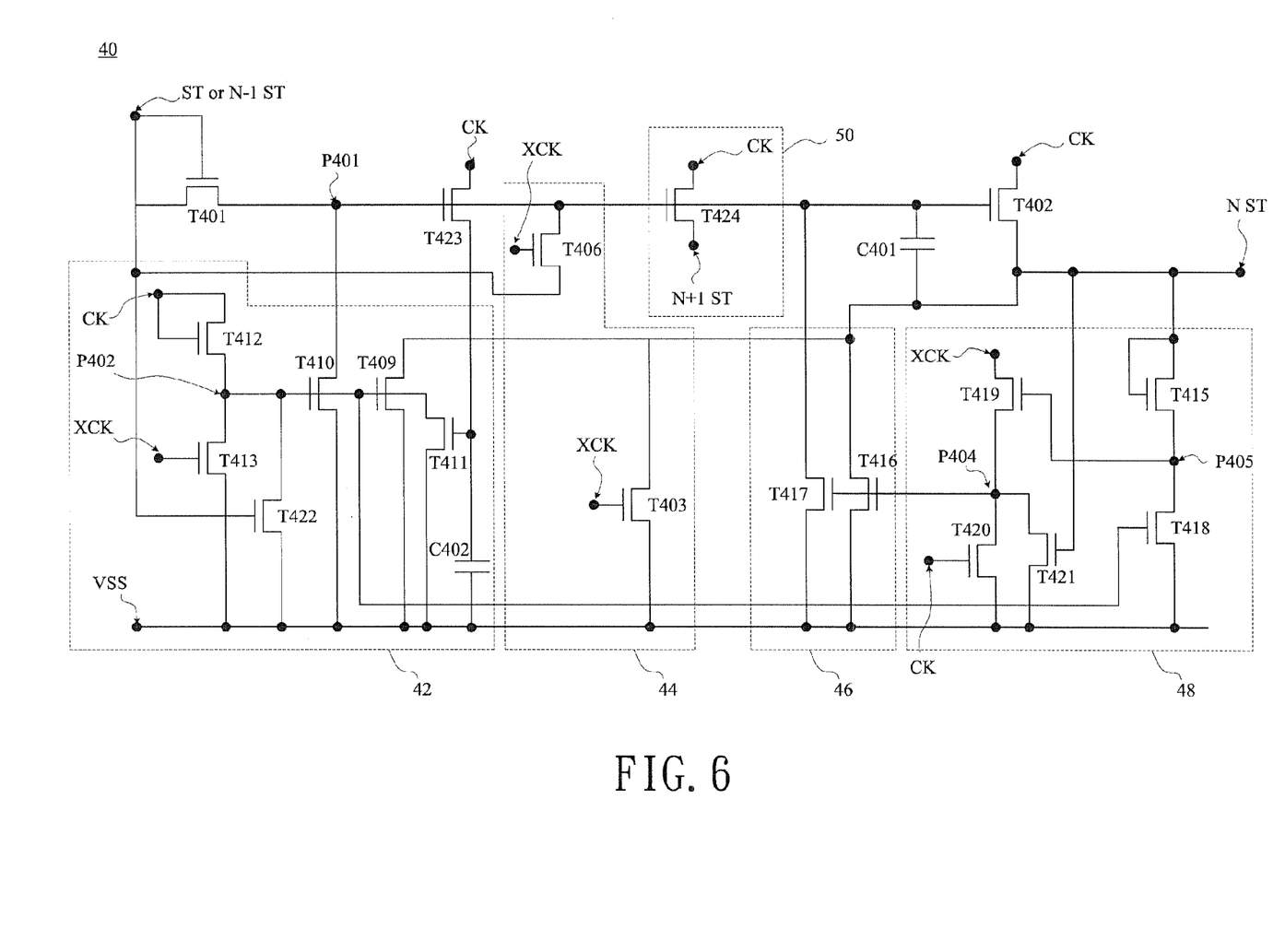
FIG. 6 is a electric circuit of a single-stage shift register according to one embodiment of the present invention.

FIG. 6 is an electric circuit of the single-stage shift register 40 according to one embodiment of the present invention. The single-stage shift register 40 includes a first clock pull-down module 42, a second clock pull-down module 44, a key clock pull-down module 46, and a self-feedback module 48. There is a phase difference, such as 180 degrees, between the first clock and the second clock. For example, the first clock is "CK" clock signal and the second clock is "XCK" clock signal, wherein "CK" and "XCK" are mutually inverted. The first clock pull-down module 42 is composed of six transistors "T409", "T410", "T411", "T412", "T413", and "T422". While the signal voltage level of the first clock pull-down module 12 is high, i.e. the signal voltage level of the second clock pull-down module 44 is low, transistors "T412" and "T410" are triggered so that the signal voltage levels of node "P401" and the gate of transistor "T402" are pulled down to voltage level "VSS" via the transistor "T410", wherein "VSS" is the lowest voltage level of the single-stage shift register 40. The second clock pull-down module 44 is composed of two transistors "T403" and "T406". While the signal voltage level of the second clock pull-down module 44 is high, i.e. the signal voltage level of the first clock pull-down module 42 is low, transistors "T403" and "T413" are triggered so that the capacitor "C401" and transistor "T402" are discharged for cancelling residual electric charges. The signal voltage levels of node "P402" and the drain of transistor "T402" are pulled down to low voltage level via the transistor "T413". The key clock pull-down module 46 is composed of two transistors "T416" and "T417" for pulling the signal voltage levels of node "P401" and the gate of transistor "T402", respectively, down to low voltage level via the transistor "T417" after outputting an output signal to node "P401" at the transistor "T401". The self-feedback module 48 is composed of five transistors "T415", "T418", "T419", "T420", and "T421" for outputting a driving signal to the key clock pull-down module 46. The self-feedback module 48 is controlled by transistor "T402" and a driving signal ""N ST" is inputted into the self-feedback module 48.

In one preferred embodiment of the present invention, the shift register 40 further includes a driving output unit 50 for outputting a driving signal to the shift register in the next stage. For example, the driving output unit 50 includes transistor "T424", wherein the source of the transistor "T424" receives the first clock signal, the drain of the transistor "T424" outputs a driving signal "N+1 ST" to the shift register in the next stage, and the gate of the transistor "T424" receives the signal from the node "P401". While the gate of the transistor "T424" receives a high voltage level signal from the node "P401" for triggering the transistor "T424", the first clock signal is outputted to the drain of the transistor "T424" to be a driving signal "N+1 ST" of the shift register in the next stage. However, since the driving signal "N+1 ST" of the shift register in the next stage bypasses transistor "T420", the driving signal "N+1 ST" of the shift register in the next stage is irrelative to the voltage level change of the driving signal "N ST" of the self-feedback module 48. Therefore, while pixels of the panel cause any short circuit or signal error, the abnormal operation of driving circuit is avoided.

Figure 7:
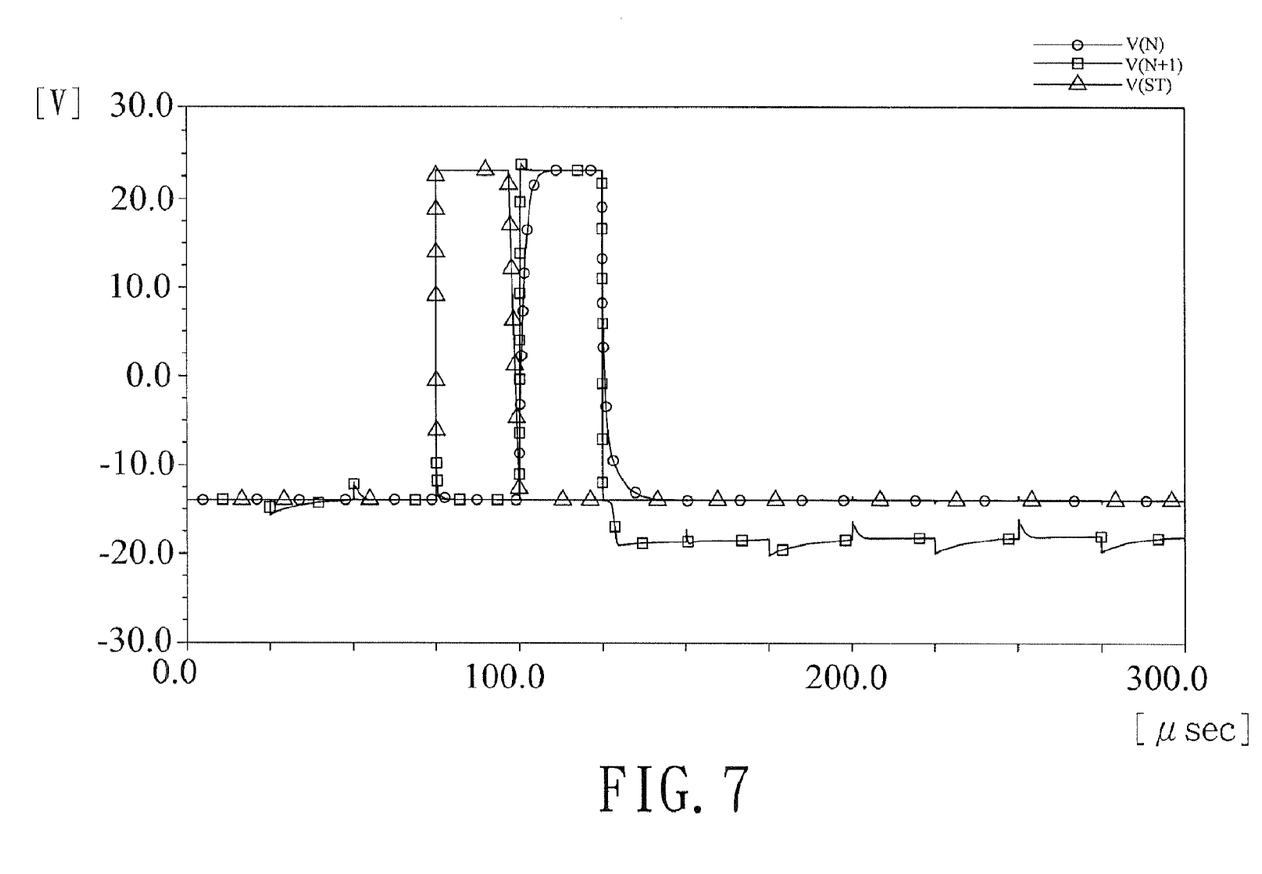
FIGS. 7-9 illustrate timing diagrams of main nodes in the single-stage shift register according to one embodiment of the present invention.
Figure 8:
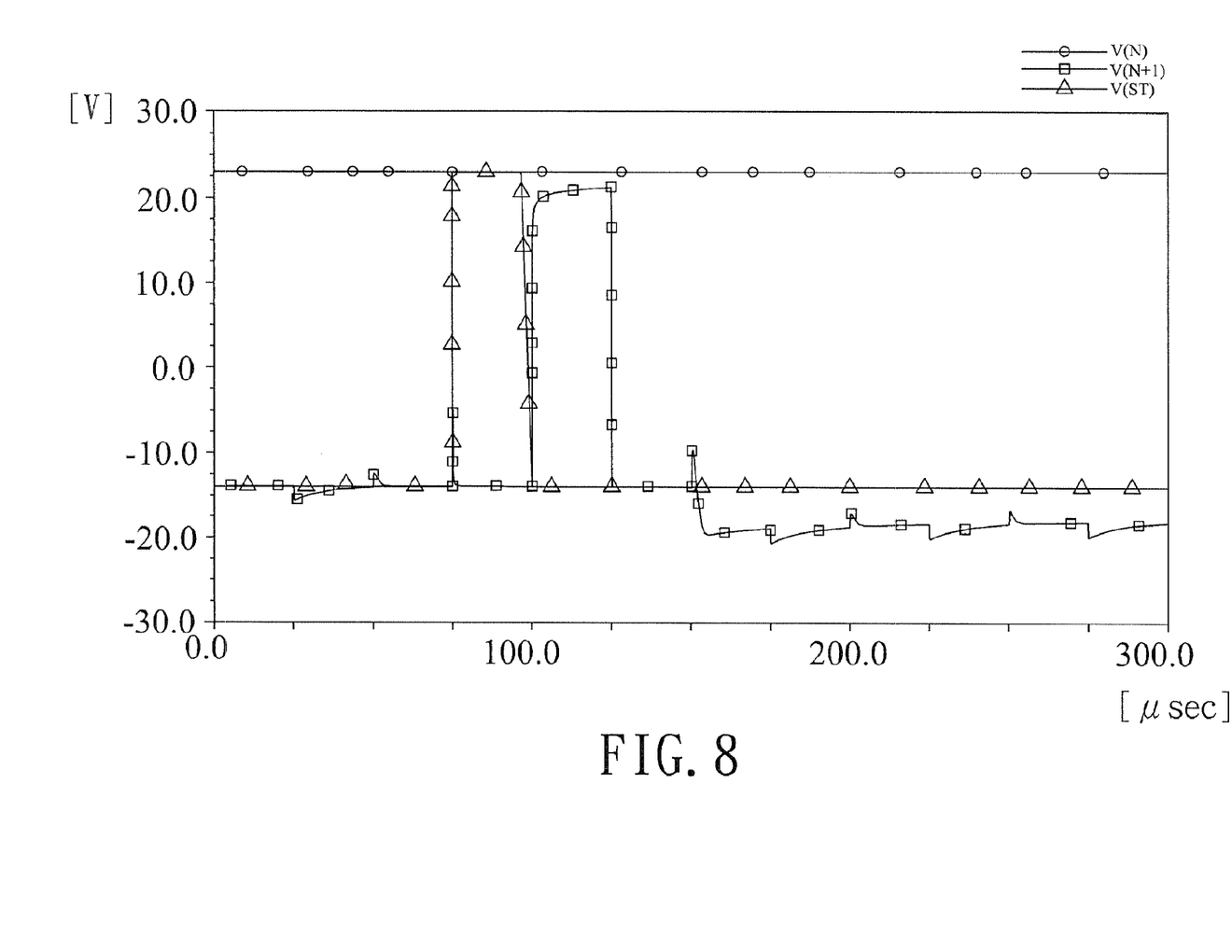
Figure 9:
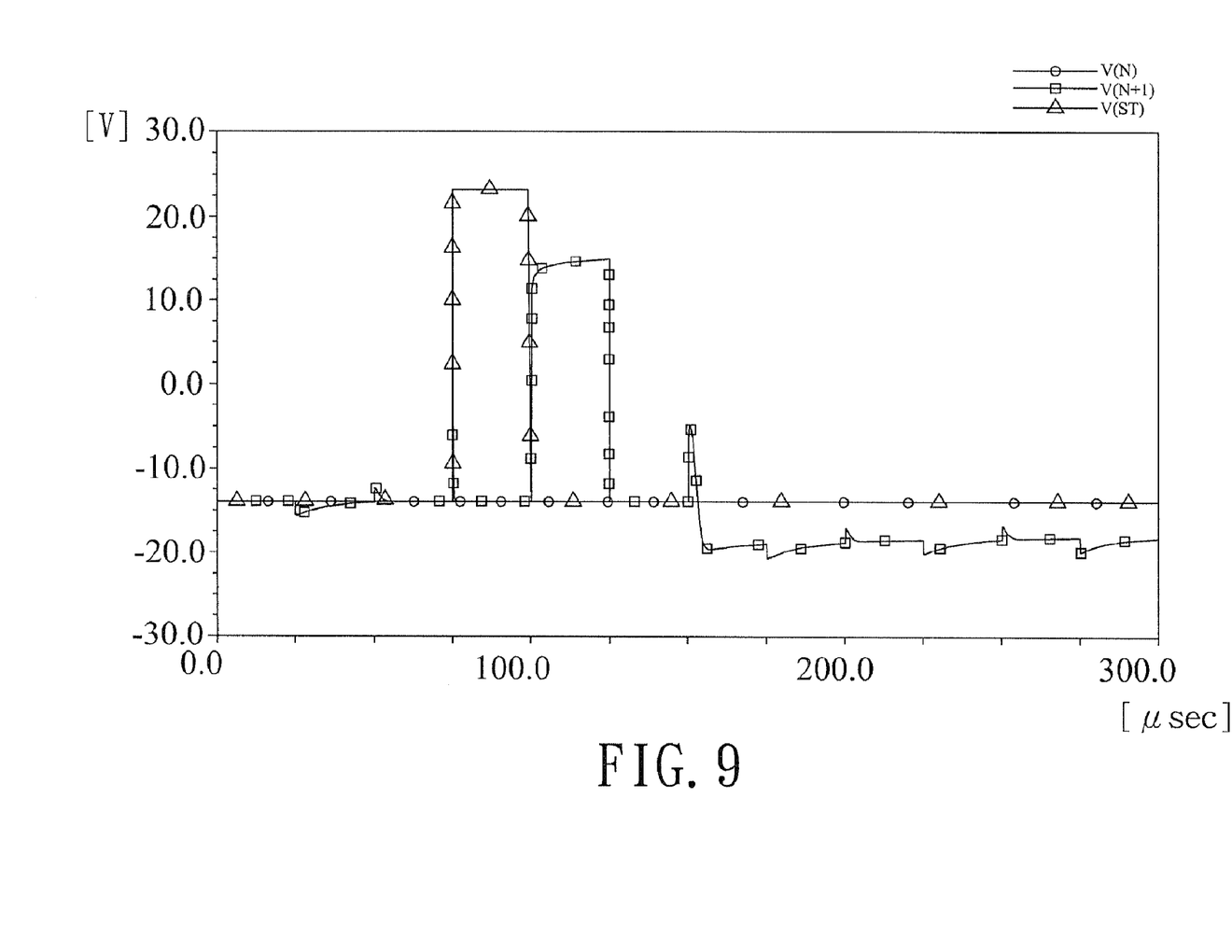

FIGS. 7-9 illustrate timing diagrams of main nodes in the single-stage shift register 40 according to one embodiment of the present invention. In FIG. 7, if the waveform "V(N)" in the node "N" and the waveform "V(ST)" in the node "ST" are in normal statuses, the waveform "V(N+1)" in the driving node "N+1 ST" has a normal voltage level and waveform. That is, the waveform "V(N+1)" is a single-triggering square waveform.

In FIG. 8, if the pixels have short circuit or signal error in the stage "N" and thus the waveform "V(N)" in the node "N" has a fixed high voltage level, the waveform "V(N+1)" in the driving node "N+1 ST" is irrelative to the waveform "V(N)", controlled by transistor "T402", in the node "N" because the transistor "T424" of driving output unit 50 controls the output signal of driving node "N+1 ST". Thus, the waveform "V(N+1)" in the driving node "N+1 ST" still has a single-triggering square waveform so that the pixels in the stage (N+1) operate correctly.

In FIG. 9, if the pixels have short circuit or signal error in the stage "N" and thus the waveform "V(N)" in the node "N" has a fixed low voltage level, the waveform "V(N+1)", controlled by transistor "T402", in the driving node "N+1 ST" is not affected by the waveform "V(N)" in the node "N" because the transistor "T424" of driving output unit 50 controls the output signal of driving node "N+1 ST". Thus, the waveform "V(N+1)" in the driving node "N+1 ST" has a single-triggering square waveform so that the pixels in the stage (N+1) operate correctly.

The shift register of the present invention utilizes a driving output unit 50 for outputting a driving pulse signal to a shift register in next stage so that an incorrect driving signal of the shift register is avoided when the shift register has short circuit or signal error in previous stage. In addition, while performing a test procedure of the panel, the present invention is capable of locating the fault pixels on the panel. Therefore, the test correction of the pixels in next different stages can be completed to reduce the test complexity even though a fault pixel is located in the previous stage.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A shift register, comprising:
   a first clock pull-down module, for pulling down a voltage level of a node to a low voltage level while a first clock signal is in a high voltage level;
   a second clock pull-down module, for pulling down the voltage level of the node to the low voltage level while a second clock signal is in a high voltage level;
   a key clock pull-down module, for pulling down the voltage level of the node to the low voltage level while the node outputs a output signal;
   a self-feedback module, for outputting a driving signal to the key clock pull-down module; and
   a driving output unit, for outputting another driving signal to the shift register in a next stage, wherein the another driving signal of the driving output unit is irrelative to the voltage level change of the driving signal of the self-feedback module.

2. The shift register of claim 1, wherein a phase difference between the first clock signal and the second clock signal is 180 degrees.

3. The shift register of claim 2, wherein the first clock signal is a "CK" clock signal and second clock signal is a "XCK" clock signal.

4. The shift register of claim 1, wherein the driving output unit is a transistor, a source of the transistor is adapted to receive the first clock signal, a drain of the transistor is adapted to output the another driving signal to the shift register in next stage, and a gate of the transistor is adapted to receive a signal from the node.

5. The shift register of claim 1, wherein the low voltage level is a voltage level "VSS".

6. A liquid crystal display, comprising:
   a liquid crystal panel having a plurality of pixel units; and
   a gate driver, for outputting a scan signal for driving the pixel units, wherein the gate driver comprises a control circuit having a plurality of shift registers and each shift register comprises:
      a first clock pull-down module, for pulling down a voltage level of a node to a low voltage level while a first clock signal is in a high voltage level;
      a second clock pull-down module, for pulling down the voltage level of the node to the low voltage level while a second clock signal is in a high voltage level;
      a key clock pull-down module, for pulling down the voltage level of the node to the low voltage level while the node outputs a output signal;
      a self-feedback module, for outputting a driving signal to the key clock pull-down module; and
      a driving output unit, for outputting another driving signal to the shift register in a next stage, wherein the another driving signal of the driving output unit is irrelative to the voltage level change of the driving signal of the self-feedback module.

7. The liquid crystal display of claim 6, wherein a phase difference between the first clock signal and the second clock signal is 180 degrees.

8. The liquid crystal display of claim 7, wherein the first clock signal is a "CK" clock signal and the second clock signal is a "XCK" clock signal.

9. The liquid crystal display of claim 6, wherein the driving output unit is a transistor, a source of the transistor is adapted to receive the first clock signal, a drain of the transistor is adapted to output the another driving signal to the shift register in next stage, and a gate of the transistor is adapted to receive a signal from the node.

10. The liquid crystal display of claim 6, wherein the low voltage level is a voltage level "VSS".

* * * * *